US011264959B2

(12) United States Patent
Gupta et al.

(10) Patent No.: US 11,264,959 B2
(45) Date of Patent: Mar. 1, 2022

(54) REFERENCE PRECHARGE SYSTEM

(71) Applicant: TEXAS INSTRUMENTS INCORPORATED, Dallas, TX (US)

(72) Inventors: Amit Kumar Gupta, Frisco, TX (US); Peng Cao, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/903,030

(22) Filed: Jun. 16, 2020

(65) Prior Publication Data

US 2021/0391836 A1   Dec. 16, 2021

(51) Int. Cl.
*H03F 1/02*   (2006.01)
*H03F 3/45*   (2006.01)
*H03F 3/30*   (2006.01)

(52) U.S. Cl.
CPC ....... *H03F 3/3035* (2013.01); *H03F 3/45475* (2013.01); *H03F 3/45659* (2013.01); *H03F 2200/78* (2013.01); *H03F 2203/45418* (2013.01); *H03F 2203/45424* (2013.01)

(58) Field of Classification Search
CPC ............... H03F 3/3035; H03F 3/45659; H03F 3/45475; H03F 2203/45418; H03F 2203/45424; H03F 2200/78; H03M 3/464; H03M 3/494; H03M 3/422; H03M 3/496
USPC ....... 341/143, 155, 172; 330/9, 51, 258, 262
See application file for complete search history.

(56) References Cited

U.S. PATENT DOCUMENTS

| 6,249,240 | B1 | 6/2001 | Bellaouar | |
|---|---|---|---|---|
| 7,501,972 | B2 | 3/2009 | Wakamatsu | |
| 9,748,965 | B2 | 8/2017 | Francis et al. | |
| 10,122,376 | B2 | 11/2018 | Kalathil et al. | |
| 10,284,222 | B1* | 5/2019 | Gupta | H03M 3/464 |
| 2014/0085121 | A1* | 3/2014 | Ebata | H03M 1/1076 |
| | | | | 341/155 |

OTHER PUBLICATIONS

International Search Report in corresponding PCT Application No. PCT/US2021/037545, dated Sep. 23, 2021 (2 pages).

* cited by examiner

*Primary Examiner* — Khanh V Nguyen
(74) *Attorney, Agent, or Firm* — John R. Pessetto; Charles A. Brill; Frank D. Cimino

(57) ABSTRACT

A precharge circuit comprises a gain amplifier, a comparator, a reservoir capacitor, a switch, a current source, and a switching network. The gain amplifier has a gain G1 and receives an input voltage Vrefp. The gain amplifier outputs an amplified voltage G1Vrefp to the comparator, which compares G1Vrefp to a voltage across the reservoir capacitor. The comparator outputs a control signal for the switch based on the comparison. The switch couples the current source to the reservoir capacitor. The current from the current source charges the reservoir capacitor. The switching network couples the reservoir capacitor to an output of the precharge circuit during a first operating mode and provides the input voltage Vrefp to the output during a second operating mode.

20 Claims, 8 Drawing Sheets

REFERENCE PRECHARGE SYSTEM

BACKGROUND

In many high performance systems, a bandgap reference voltage generator providing reference voltages for the analog to digital converter (ADC) is filtered to comply with desired noise performance. A buffer integrated in the ADC between the external pin and the ADC reference input reduces the load on the reference input pin. Some ADCs use a precharge buffer to reduce the switching load on the reference voltage generator. However, operational amplifiers in the precharge buffer consume large amounts of power, and the output of the precharge buffer, that is, the reference voltage, can dip in response to the feedback capacitor being coupled to it. For delta-sigma ADCs, the dip in reference voltage can introduce error into an integration operation performed by the ADC that assumes a fixed reference voltage. Some precharge buffers include a reservoir capacitor to reduce the dip in response to the feedback capacitor being coupled to it, but consume large amounts of power and can be inaccurate in precharging the feedback digital to analog converter (DAC) capacitor. The precharge accuracy can be improved by adding gain to the precharge buffer, but at the cost of consuming even more power.

SUMMARY

An apparatus comprises a gain amplifier, a comparator, a reservoir capacitor, a logic circuit, a current source, a common mode feedback (CMFB) loop, a current sink, and a switching network. The gain amplifier is coupled to the comparator and to a first voltage terminal. The cathode of the reservoir capacitor is coupled to the comparator. The logic circuit is coupled to the comparator and generates a first control signal for a first switch and a second switch. The first switch couples the current source to the cathode, and the second switch coupled the anode of the reservoir capacitor to the current sink. The CMFB loop is coupled to the anode, the cathode, and a common mode voltage terminal and generates a second control signal for the current sink. The switching network couples the cathode to a first output of the apparatus and the anode to a second output of the apparatus based on a third control signal. The switching network couples the first voltage terminal to the first output and a second voltage terminal to the second output based on a fourth control signal.

In some examples, the switching network comprises a third switch, a fourth switch, a fifth switch, and a sixth switch. The third switch couples the cathode to the first output. The fourth switch couples the anode to the second output. The fifth switch couples the first voltage terminal to the first output. The sixth switch couples the second voltage terminal to the second output. In some examples, the first and second outputs are coupled to an ADC, and the third control signal causes the third and fourth switches to be closed during a coarse charging portion of an integrating operation performed by the ADC. The fourth control signal causes the fifth and sixth switches to be closed during a fine charging portion of the integrating operation performed by the ADC. In some examples, the first control signal causes the first and second switches to be closed during a sampling operation performed by the ADC.

In some examples, the CMFB loop generates the second control signal to adjust an amount of current through the current sink, such that a voltage on the common mode voltage terminal is substantially equal to half a voltage across the reservoir capacitor. In some examples, the gain amplifier includes an amplifier and two resistors. The amplifier has a first input coupled to the first voltage terminal. The first resistor is coupled to a second input of the amplifier and to the second voltage terminal. The second resistor is coupled to the second input and to the amplifier output. In some examples, the second resistor is a variable resistor, and the resistance of the second resistor is chosen to trim variations in the comparator over process and temperature.

BRIEF DESCRIPTION OF THE DRAWINGS

For a detailed description of various examples, reference will now be made to the accompanying drawings in which.

DETAILED DESCRIPTION

The disclosed reference precharge circuits include a current source and a comparator to charge a reservoir capacitor, which consume less power than an operational amplifier based precharge circuit. The comparator compares an amplified reference voltage to a voltage across the reservoir capacitor, and a logic circuit coupled to the comparator generates a control signal to uncouple the current source from the reservoir capacitor when the amplified reference voltage and the voltage across the reservoir capacitor are substantially the same. A gain amplifier can be used to generate the amplified reference voltage, and a variable resistor in the gain amplifier can be trimmed to improve the precharge accuracy over process and temperature variations.

A desired overall system gain G can be implemented by a first gain G1 of the amplified reference voltage and a second gain caused by the comparator time delay between a time at which the voltage across the reservoir capacitor becomes substantially equal to the amplified reference voltage and a time at which the current source is uncoupled from the reservoir capacitor. Using the time delay to implement a portion of the overall system gain relaxes the desired comparator speed and corresponding power consumption. To provide differential reference voltages, a current sink is coupled to the reservoir capacitor. A common mode feedback loop generates a control signal to adjust an amount of current through the current sink, such that a common mode voltage of the reservoir capacitor is substantially the same as a reference common mode voltage.

A switching network couples the cathode of the reservoir capacitor to a positive reference input of the ADC and couples the anode of the reservoir capacitor to a negative reference input of the ADC during a coarse charging portion of an integration operation performed by the ADC. The switching network uncouples the reservoir capacitor from the outputs, couples a positive reference voltage source to the positive reference input, and couples a negative reference voltage source to the negative reference input during a fine charging portion of the integration operation.

Figure 1:
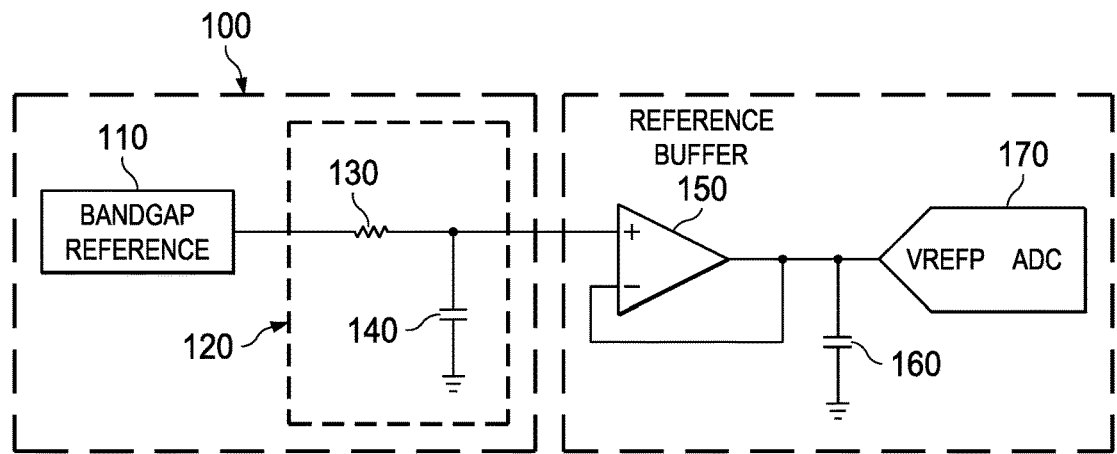
FIG. 1 illustrates a positive reference voltage generator for an ADC.

FIG. 1 illustrates a positive reference voltage generator 100 for an ADC 170. The positive reference voltage generator 100 includes a bandgap reference voltage generator 110, a filter 120, a buffer 150, and a capacitor 160. Filter 120 include a resistor 130 and a capacitor 140. For high performance ADCs, the bandgap reference voltage can be filtered to reduce noise. In voltage generator 100, filter 120 filters the voltage output from bandgap reference voltage generator 110. The buffer 150 is placed between resistor 130 and the ADC 170, and capacitor 160 is coupled to the output of buffer 150 and to the ADC 170.

Buffer 150 reduces the load on the bandgap 110 reducing the error caused by resistor 130 in series between the bandgap reference voltage generator 110 and ADC 170. Buffer 150 can be a precharge buffer, since noise from the precharge buffer does not affect the noise performance of ADC 170. The positive reference voltage generator 100 may be incorporated into an integrated circuit separate from an integrated circuit including the ADC 170 to simplify the overall system design, as the buffer 150 does not need to be added to the system separately.

Figure 2:
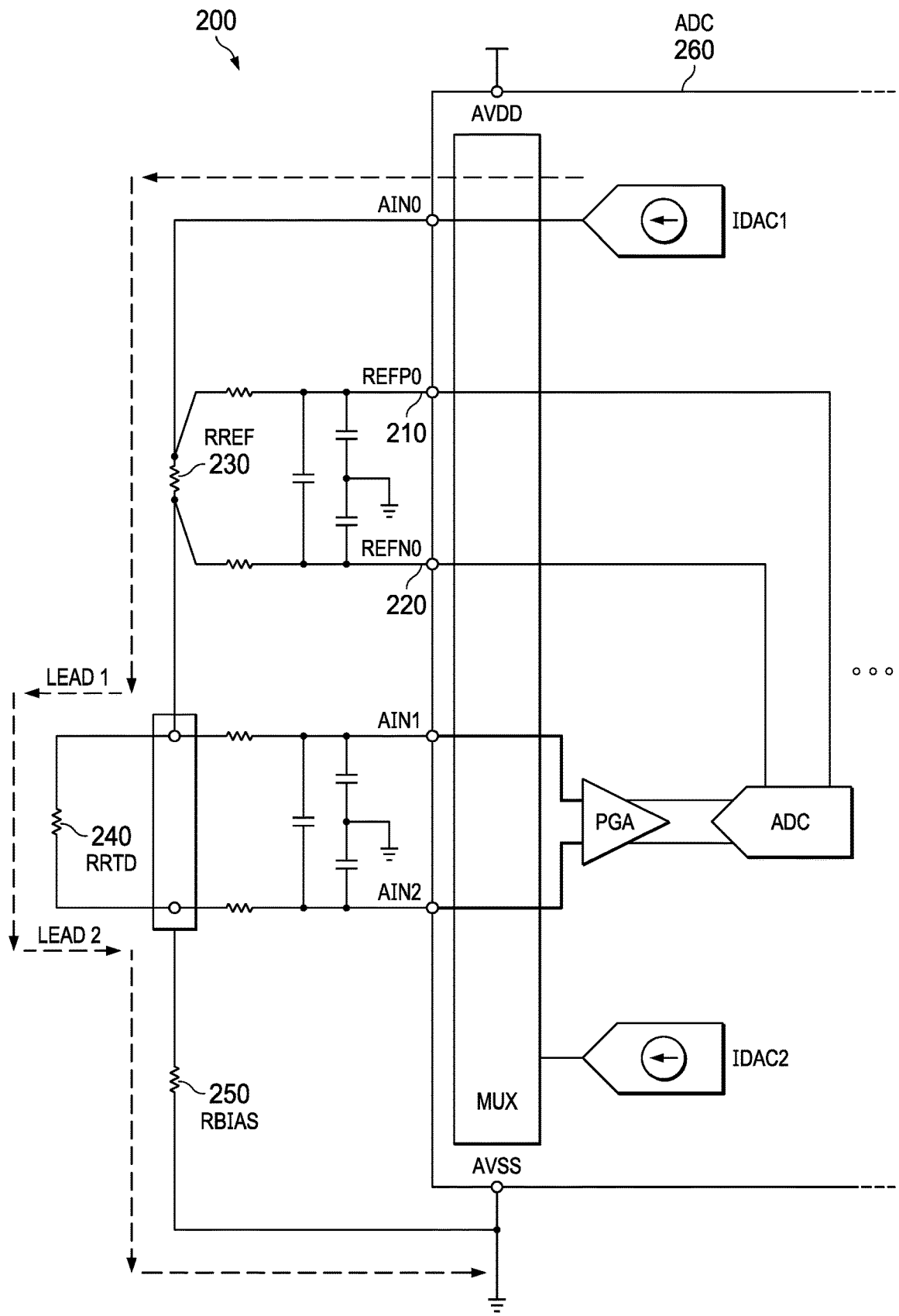
FIG. 2 illustrates a differential reference voltage generator for an ADC.

FIG. 2 illustrates an ADC 260 configured to measure temperature using a ratiometric resistance temperature detector (RTD), which can reduce error in the temperature measurements by measuring the resistance of the RTD as a ratio of a reference resistance instead of using an absolute voltage. ADC 260 generates a reference current IDAC1 and provides it to the reference resistor Rref 230, which is coupled across the positive reference voltage input 210 and the negative reference voltage input 220. The RTD resistance Rrtd 240 is coupled to Rref 230 and to a biasing resistor Rbias 250. To ensure the voltage across Rref 230 is not loaded by the current draw from the ADC 260, both the positive and negative reference voltages need to be buffered.

Figure 3A:
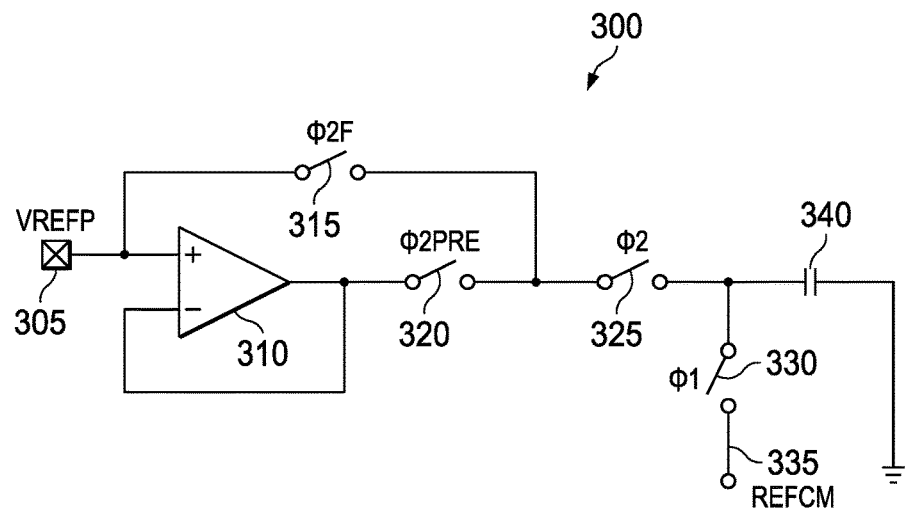
FIGS. 3A-B illustrate an example precharge system integrated into an ADC and a timing diagram of the control signals within the example precharge system.

FIG. 3A illustrates an example precharge system 300 for use in an ADC, such as ADC 170 or 260. The precharge system 300 includes a precharge amplifier 310 and switches 315-330. Precharge amplifier 310 can be an operational amplifier. Switch 325 is configured to couple the output of precharge amplifier 310 to the feedback DAC capacitor Cdac 340 during an integration operation φ2. Switch 330 is configured to couple a reference common mode voltage Vrefcm 335 to Cdac 340 during a sampling operation φ1. The positive input of precharge amplifier 310 is configured to receive a positive reference voltage Vrefp 305, and the negative input of precharge amplifier 310 is coupled to the output of precharge amplifier 310. Switch 320 is configured to couple the output of precharge amplifier 310 to Cdac 340 through closed switch 325 during a coarse charging portion φ2PRE of the integration operation φ2. Switch 315 is configured to couple Vrefp 305 to the output of precharge amplifier 310 and to Cdac 340 through closed switch 325 during a fine charging portion φ2F of the integration operation φ2.

Precharge amplifier 310 quickly charges Cdac 340 to approximately Vrefp 305 during the coarse charging portion φ2PRE, and the external reference voltage generator providing Vrefp 305 charges Cdac 340 more precisely to Vrefp 305 during the fine charging portion φ2F. However, the output of the precharge amplifier 310 may dip in response to being coupled to Cdac 340, which may introduce error into the integration operation φ2 which assumes a fixed reference voltage. Because the precharge amplifier 310 must settle in less than a quarter of a clock cycle, it consumes a lot of current.

Figure 3B:
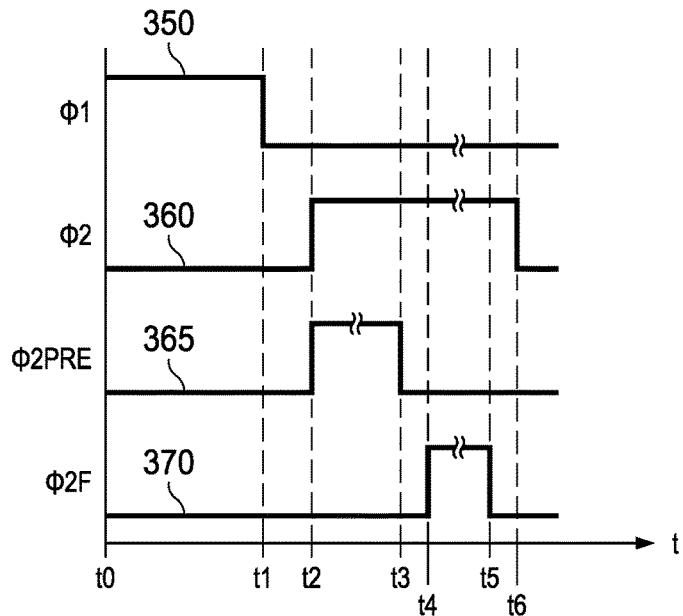

FIG. 3B illustrates a timing diagram for the example precharge system 300. At time t0, the ADC is performing a sampling operation φ1. The control signal φ1 350 causes switch 330 to be closed, coupling the reference common mode voltage Vrefcm 335 to Cdac 340. The control signal φ2 360 causes switch 325 to be open, disconnecting precharge amplifier 310 and the positive reference voltage Vrefp 305 from Cdac 340. The control signal φ2PRE 365 causes switch 320 to be open, and the control signal φ2F 370 causes switch 315 to be open. At time t1, the ADC stops performing the sampling operation φ1. The control signal φ1 350 causes switch 330 to open, disconnecting Vrefcm 335 from Cdac 340. Switches 315-325 remain open.

At time t2, the ADC performs the integration operation φ2. The control signal φ2 360 causes switch 325 to close, connecting Cdac 340 to switches 315 and 320. Switches 315 and 330 remain open. The integration operation φ2 includes a coarse charging portion φ2PRE and a fine charging portion φ2F. At t2, the coarse charging portion φ2PRE begins, and the control signal φ2PRE 365 causes switch 320 to close, connecting the output of precharge amplifier 310 to Cdac 340. Precharge amplifier 310 quickly charges Cdac 340 to approximately Vrefp 305. At time t3, the coarse charging portion φ2PRE ends. The control signal φ2PRE 365 causes switch 320 to open, disconnecting the output of amplifier 310 from Cdac 340. Switches 315 and 330 remain open, and switch 325 remains closed.

At time t4, the fine charging portion φ2F begins. The control signal φ2F 370 causes switch 315 to close, connecting the positive reference voltage Vrefp 305 from an external voltage generator to Cdac 340. Switches 320 and 330 remain open, and switch 325 remains closed. The external reference voltage generator providing Vrefp 305 charges Cdac 340 more precisely to Vrefp 305 during the fine charging portion φ2F. At time t5, the ADC finishes the integration operation φ2, and the fine charging portion φ2F ends. The control signal φ2F 370 causes switch 315 to open, disconnecting the external reference voltage provider from Cdac 340. The control signal φ2 360 causes switch 325 to open, disconnecting Cdac 340 from switches 315 and 320. Switches 320 and 330 remain open.

Figure 4A:
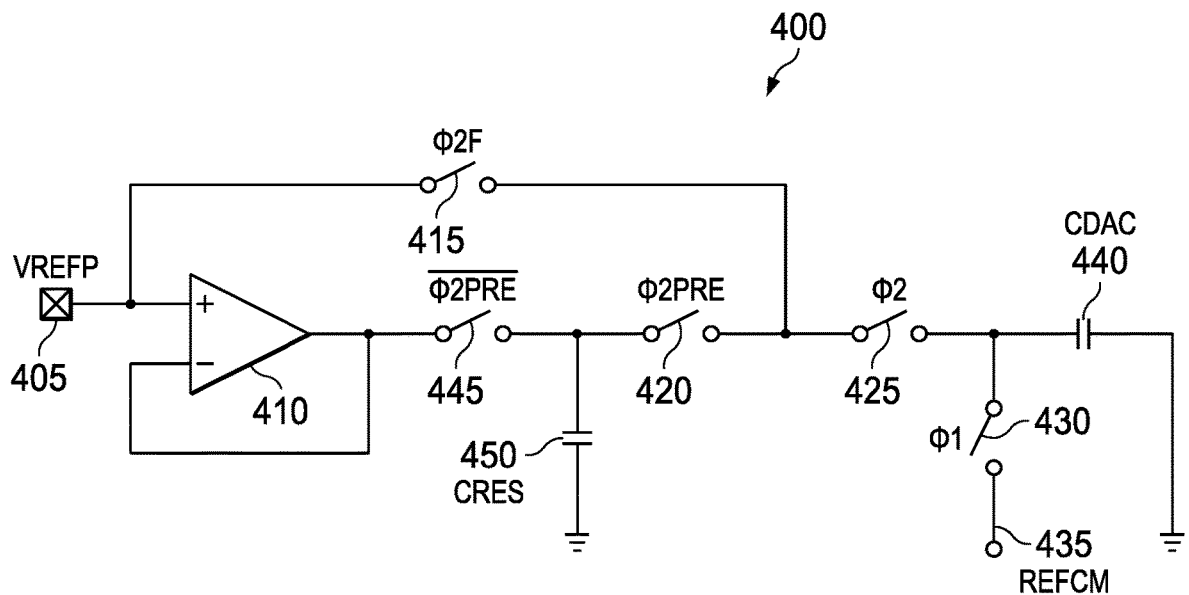
FIGS. 4A-B illustrate a further example precharge system with a reservoir capacitor integrated into an ADC and a timing diagram of the control signals within the example precharge system.

FIG. 4A illustrates a further example precharge system 400 with a reservoir capacitor 450 for use in an ADC. Precharge system 400 is similar to precharge system 300 shown in FIG. 3, and includes an additional switch 445 and the reservoir capacitor 450. Switch 445 is configured to couple the output of precharge amplifier 410 to the reservoir capacitor Cres 450 while the precharge system 400 is not in the coarse charging portion φ2PRE of the integration operation φ2, such as during the sampling operation φ1 or the fine charging portion φ2F of the integration operation φ2. Cres 450 has a much larger capacitance than a capacitance of Cdac 440.

While the precharge system is not in the coarse charging portion φ2PRE, switch 445 is closed and the output of precharge amplifier 410 charges Cres 450 to approximately Vrefp 405. During the coarse charging portion φ2PRE of the integration operation φ2, switch 445 opens, disconnecting Cres 450 from the output of precharge amplifier 410, and switch 420 closes, connecting Cres 450 to Cdac 440 through closed switch 425. Through charge sharing, Cdac 440 is charged to approximately:

$$\frac{Vrefp * Cres}{Cres + Cdac}$$

where Vrefp represents the positive reference voltage Vrefp 405, Cres represents the capacitance of reservoir capacitor Cres 450, and Cdac represents the capacitance of the DAC capacitor Cdac 440.

Because precharge amplifier 410 is disconnected from the Cdac 440 and Cres 450 provides the reference voltage during the coarse charging portion φ2PRE, the reference voltage provided to the DAC dips less than the reference voltage provided to the DAC by precharge system 300 shown in FIG. 3. However, the precharge amplifier 410 consumes large amounts of power, and the precharge system does not accurately charge Cdac 440. The charging accuracy of precharge amplifier 410 may be improved by introducing gain through precharge amplifier 410, but at the cost of even higher power consumption.

Figure 4B:
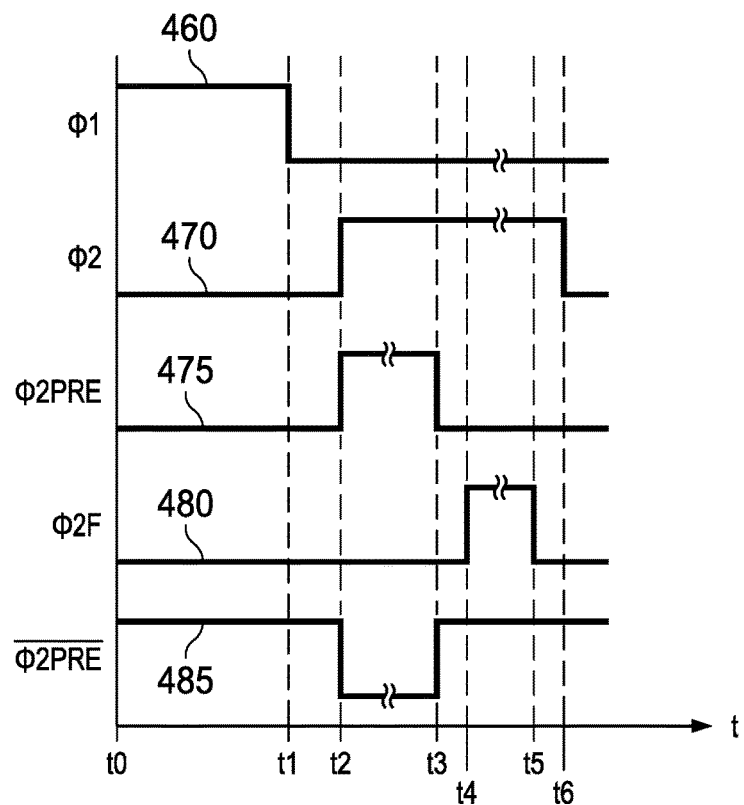

FIG. 4B illustrates a timing diagram for the example precharge system 400. At time t0, the ADC is performing a sampling operation φ1. The control signal φ1 460 causes switch 430 to be closed, connecting the common mode reference voltage Vrefcm 435 to Cdac 440. The control signal φ2 470 causes switch 425 to be open, disconnecting Cdac 440 from switches 415 and 420. The control signal φ2PRE 475 causes switch 420 to be open. Because φ2PRE 475 indicates the example precharge system 400 is not in the coarse charging portion φ2PRE of the integration operation φ2, the control signal φ2PRE 485 causes switch 445 to be closed. Cres 450 is charged by the output of precharge amplifier 410. The control signal φ2F 480 causes switch 415 to be open.

At time t1, the ADC stops performing the sampling operation φ1. The control signal φ1 460 causes switch 430 to open, disconnecting Vrefcm 435 from Cdac 440. Switches 415-425 remain open, and switch 445 remains closed. At time t2, the ADC performs the integration operation φ2. The control signal φ2 470 causes switch 425 to close, connecting Cdac 440 to switches 415 and 420. Switches 415, 420, and 430 remain open. The integration operation φ2 includes a coarse charging portion φ2PRE and a fine charging portion φ2F.

At t2, the coarse charging portion φ2PRE begins. The control signal φ2PRE 475 causes switch 420 to close, connecting Cres 450 to Cdac 440 through closed switch 425. The control signal φ2PRE 485 causes switch 445 to open, disconnecting the output of precharge amplifier 410 from Cres 450. Through charge sharing, Cres 450 charges Cdac 440 to approximately:

$$\frac{Vrefp * Cres}{Cres + Cdac}$$

At time t3, the coarse charging portion φ2PRE ends. The control signal φ2PRE 475 causes switch 420 to open, disconnecting Cres 450 from Cdac 440. Switches 415 and 430 remain open, and switch 425 remains closed.

At time t4, the fine charging portion φ2F begins. The control signal φ2F 480 causes switch 415 to close, connecting the positive reference voltage Vrefp 405 from an external voltage generator to Cdac 440. Switches 420 and 430 remain open, and switch 425 remains closed. Since the coarse charging portion φ2PRE is ended, the control signal φ2PRE 485 causes switch 445 to close, and the output of precharge amplifier 410 recharges Cres 450. The external reference voltage generator providing Vrefp 405 charges Cdac 440 more precisely to Vrefp 405 during the fine charging portion φ2F. At time t5, the ADC finishes the integration operation φ2, and the fine charging portion φ2F ends. The control signal φ2F 480 causes switch 415 to open, disconnecting the external reference voltage provider from Cdac 440. The control signal φ2 470 causes switch 425 to open, disconnecting Cdac 440 from switches 415 and 420. Switches 420 and 430 remain open.

Figure 5:
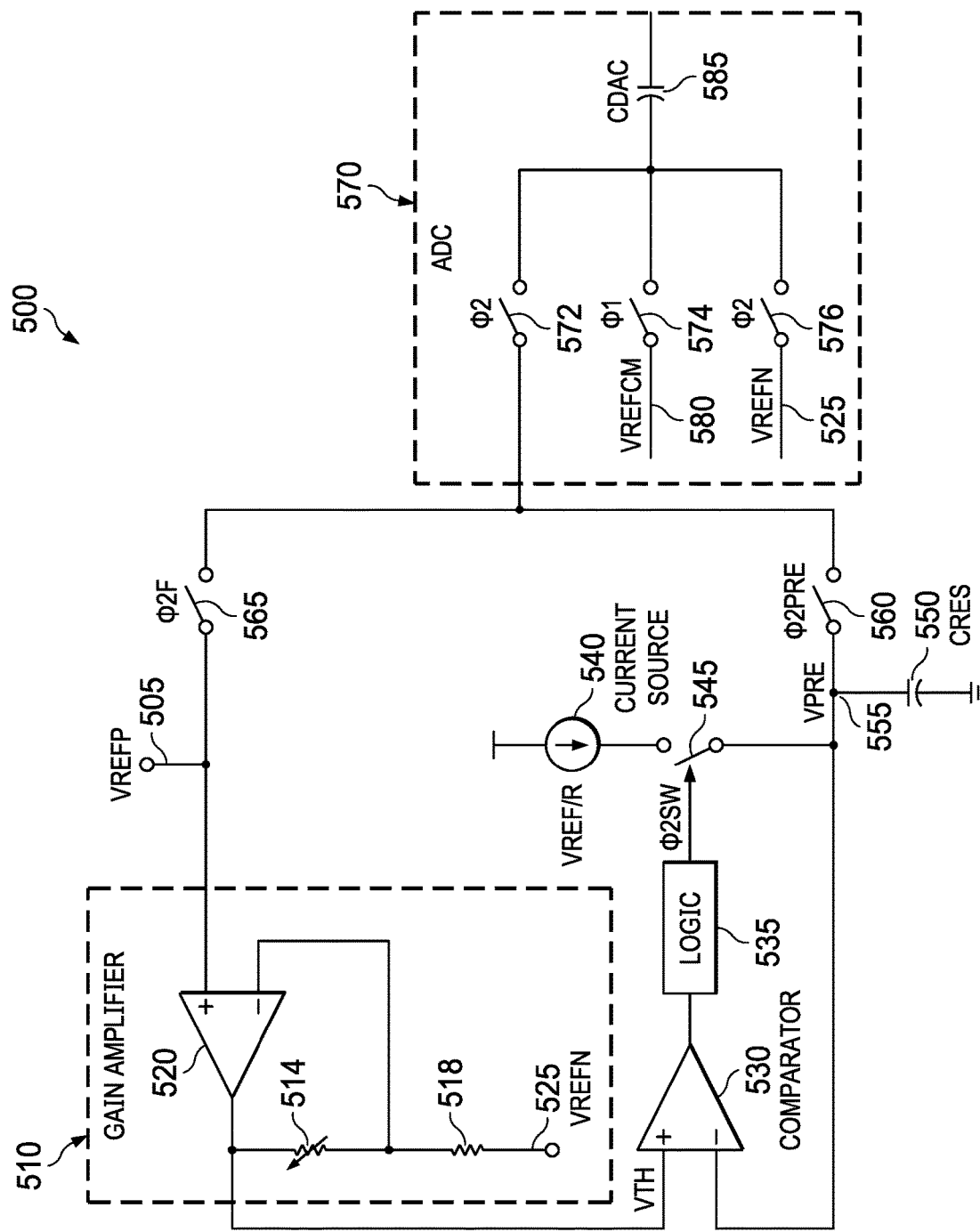
FIG. 5 illustrates an example reference precharge system for integration into an ADC.

FIG. 5 illustrates an example reference precharge system 500 for use in an ADC. The reference precharge system 500 includes a gain amplifier 510, a comparator 530, a logic circuit 535, a current source 540, a reservoir capacitor 550, and switches 545, 560, and 565. The gain amplifier has a gain G1 and includes an amplifier 520, a variable resistor 514, and a resistor 518. A positive input of amplifier 520 is configured to receive a positive reference voltage Vrefp 505 from an external voltage generator, such as a bandgap reference voltage generator 110 shown in FIG. 1. The variable resistor 514 is coupled between the negative input and the output of amplifier 520. Resistor 518 is coupled between the negative input of amplifier 520 and a terminal configured to receive a negative reference voltage Vrefn 525 from an external voltage generator, such as the bandgap reference voltage generator 110.

The output of amplifier 520 is coupled to a positive input of comparator 530. The negative input of comparator 530 is coupled to node 555. The output of comparator 530 is coupled to the logic circuit 535, which generates a control signal for switch 545. The current source 540 is coupled to node 555 when switch 545 is closed and generates a current Icharge that may be represented as:

$$Icharge = \frac{Vrefp\,505 - Vrefn\,525}{R}$$

where R represents an internal resistance of current source 540. Reservoir capacitor Cres 550 is connected to node 555 and to ground and has a much larger capacitance than a capacitance of Cdac 585.

The comparator 530 compares the output of gain amplifier 510, approximately G1 times Vrefp 505, to the voltage across Cres 550 on node 555. While the voltage across Cres 550 is less than the output of gain amplifier 510, logic circuit 535 causes the switch 545 to be closed, connecting current source 540 to Cres 550. In response to the voltage across Cres 550 being substantially equal to the output of gain amplifier 510, logic circuit 535 causes switch 545 to open, disconnecting current source 540 from Cres 550. The delay between the voltage across Cres 550 reaching approximately the output of gain amplifier 510 and switch 545 opening allows Cres 550 to continue charging for a period of time, implementing an additional gain G2.

Overall, current source 540 charges Cres 550, such that a voltage Vpre across Cres 550 may be represented as:

$$Vpre = (G1 + G2) * (Vrefp\, 505 - Vrefn\, 525)$$

$$Vpre = \left(1 + \frac{Cdac\, 585}{Cres\, 550}\right) * (Vrefp\, 505 - Vrefn\, 525)$$

Figure 7:
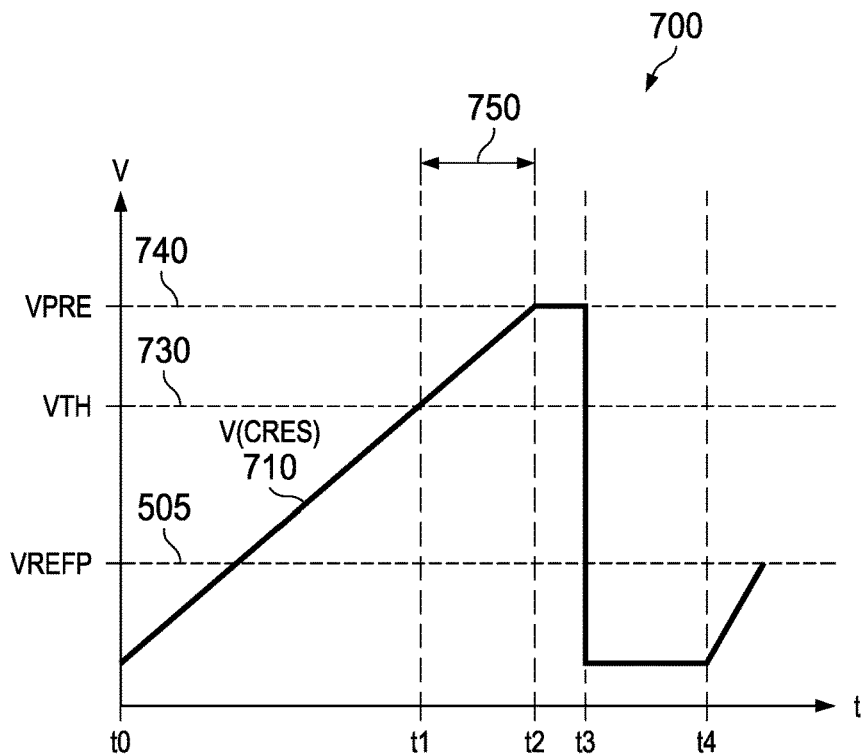
FIG. 7 illustrates a graph of the voltage across the reservoir capacitor in the reference precharge system shown in FIG. 5 over time.

Gain amplifier 510 provides a partial gain G1 of the gain G, and the remaining portion of the gain G2 may be implemented using the delay in comparator 530, as discussed further herein with reference to FIG. 7. By charging Cres 550 and by extension Cdac 585 with comparator 530 and current source 540 rather than an operational amplifier, reference precharge system 500 uses lower power than the operational amplifier based buffer systems 300 and 400 described herein in FIGS. 3A and 4A.

During the coarse charging portion φ2PRE of the integration operation φ2, switch 545 disconnects current source 540 from Cres 550, and switch 560 closes, connecting Cres 550 to Cdac 585 through closed switch 572. In the fine charging portion φ2F of the integration operation φ2, switch 560 opens, disconnecting Cres 550 from Cdac 585, and switch 565 closes, connecting the external voltage generator providing Vrefp 505 to Cdac 585 through closed switch 572. The Cdac 585 also receives the negative reference voltage Vrefn 525 through switch 576 during the integration operation φ2. In a sampling operation φ1, switches 572 and 576 are open, disconnecting Cdac 585 from the positive and negative reference voltages. Switch 574 is closed, connecting a reference common mode voltage Vrefcm 580 to Cdac 585.

Figure 6:
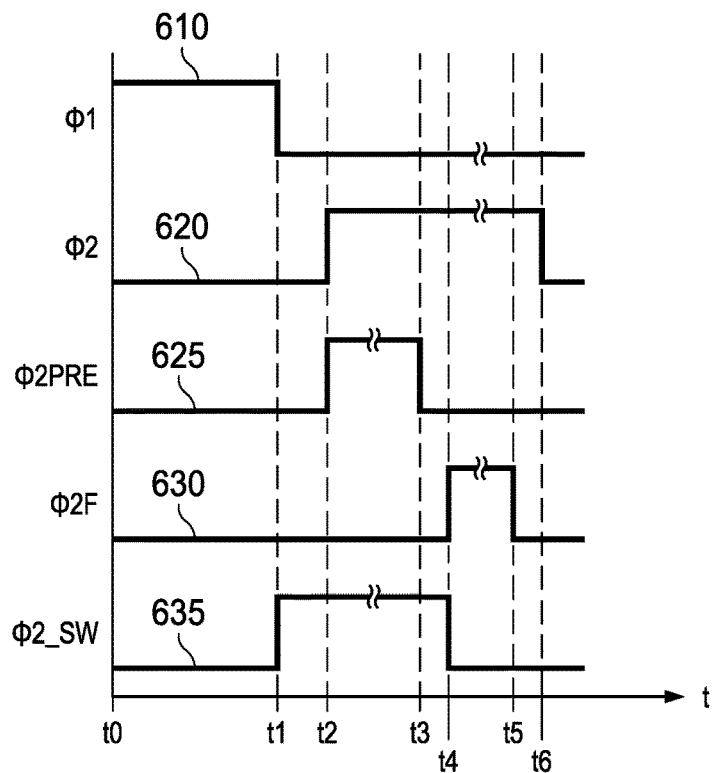
FIG. 6 illustrates a timing diagram for the reference precharge system shown in FIG. 5.

FIG. 6 illustrates a timing diagram for the reference precharge system shown in FIG. 5. At time t0, the ADC is performing a sampling operation φ1. The control signal φ1 610 causes switch 574 to be closed, connecting the common mode reference voltage Vrefcm 580 to Cdac 585. The control signal φ2 620 causes switches 572 and 576 to be open, disconnecting Cdac 585 from switches 560 and 565 and the positive and negative reference voltages Vrefp 505 and Vrefn 525. The control signal φ2PRE 625 causes switch 560 to be open, disconnecting Cres 550 from open switch 572. The control signal φ2F 630 causes switch 565 to be open, disconnecting the external voltage generator providing Vrefp 505 from open switch 572. The control signal φ2_SW 635 causes switch 545 to be closed, connecting the current source 540 to Cres 550. Current source 540 charges Cres 550 such that Cres 550 has a voltage Vpre across it, as discussed previously herein.

At time t1, the ADC finishes the sampling operation φ1. The control signal φ1 610 causes switch 574 to open, disconnecting Vrefcm 580 from Cdac 585. Switches 572, 576, 560, and 565 remain open. The control signal φ2_SW 635 causes switch 545 to open, disconnecting the current source 540 and Cres 550. At time t2, the ADC performs the integration operation φ2. The control signal φ2 620 causes switches 572 and 576 to close, connecting Cdac 585 to switches 560 and 565 and to negative reference voltage Vrefn 525. Switches 574, 565, and 545 remain open. At t2, the coarse charging portion φ2PRE begins. The control signal φ2PRE 625 causes switch 560 to close, connecting Cres 550 to Cdac 585 through closed switch 572. Through charge sharing, Cres 550 charges Cdac 585 to Vrefp_coarse. At time t3, the coarse charging portion φ2PRE ends. The control signal φ2PRE 625 causes switch 560 to open, disconnecting Cres 550 from Cdac 585. Switches 574, 565, and 545 remain open.

At time t4, the fine charging portion φ2F begins. The control signal φ2F 630 causes switch 565 to close, connecting the positive reference voltage Vrefp 505 from an external voltage generator to Cdac 585. Switches 574 and 560 remain open. The control signal φ2_SW causes switch 545 to close, connecting the current source 540 to Cres 550. The external reference voltage generator providing Vrefp 505 charges Cdac 585 more precisely to Vrefp 505 during the fine charging portion φ2F. At time t5, the fine charging portion φ2F ends. The control signal φ2F 630 causes switch 565 to open, disconnecting the external reference voltage provider from Cdac 585. At time t6, the ADC finishes the integration operation φ2. The control signal φ2 620 causes switches 572 and 576 to open, disconnecting Cdac 585 from switches 560 and 565 and the positive and negative reference voltages.

FIG. 7 illustrates a graph of the voltage V(Cres) 710 across the reservoir capacitor 550 over time. Between t0 and t1, current source 540 charges Cres 550, and the voltage V(Cres) 710 increases, crossing the positive reference voltage 505. At t1, V(Cres) 710 reaches the threshold voltage Vth 730 output from gain amplifier 510, G1 times Vrefp 505. Between t1 and t2, comparator 530 and logic circuit 535 determine V(Cres) 710 is approximately the same as Vth 730 and cause switch 545 to open. At time t2, switch 545 opens and disconnects current source 540 from Cres 550. During the delay 750 between t1 and t2 from comparator 540 and logic circuit 535, current source 540 continues to charge Cres 550. V(Cres) 710 increases from Vth 730 to Vpre 740, which may be represented as:

$$Vpre\,740 = Vth\,730 + Icharge * \frac{tdelay}{Cres}$$

$$Vpre\,740 =$$
$$G1(Vrefp\,505 - Vrefn\,525) + (Vrefp\,505 - Vrefn\,525)\left(\frac{tdelay}{R*Cres}\right)$$

$$Vpre\,740 = (Vrefp\,505 - Vrefn\,525)\left(G1 + \left(\frac{tdelay}{R*Cres}\right)\right)$$

where tdelay represents the delay 750 between t1 and t2.

By leveraging the comparator delay 750 to implement gain, the comparator speed can be reduced, decreasing the power consumption of reference precharge system 500. The gain G1 of gain amplifier 510 can be trimmed using the variable resistor 514 to compensate for variations in the comparator delay 750 over process and temperature variations. At time t3, switch 560 is closed, connecting Cres 550 to Cdac 585 through closed switch 572. Cres 550 charges Cdac 585 through charge sharing, decreasing V(Cres) 710 below the positive reference voltage 505. At time t4, switch 560 is opened, disconnecting Cres 550 from Cdac 585. Switch 545 is closed, connecting current source 540 and Cres 550. Current source 540 begins recharging Cres 550.

Figure 8:
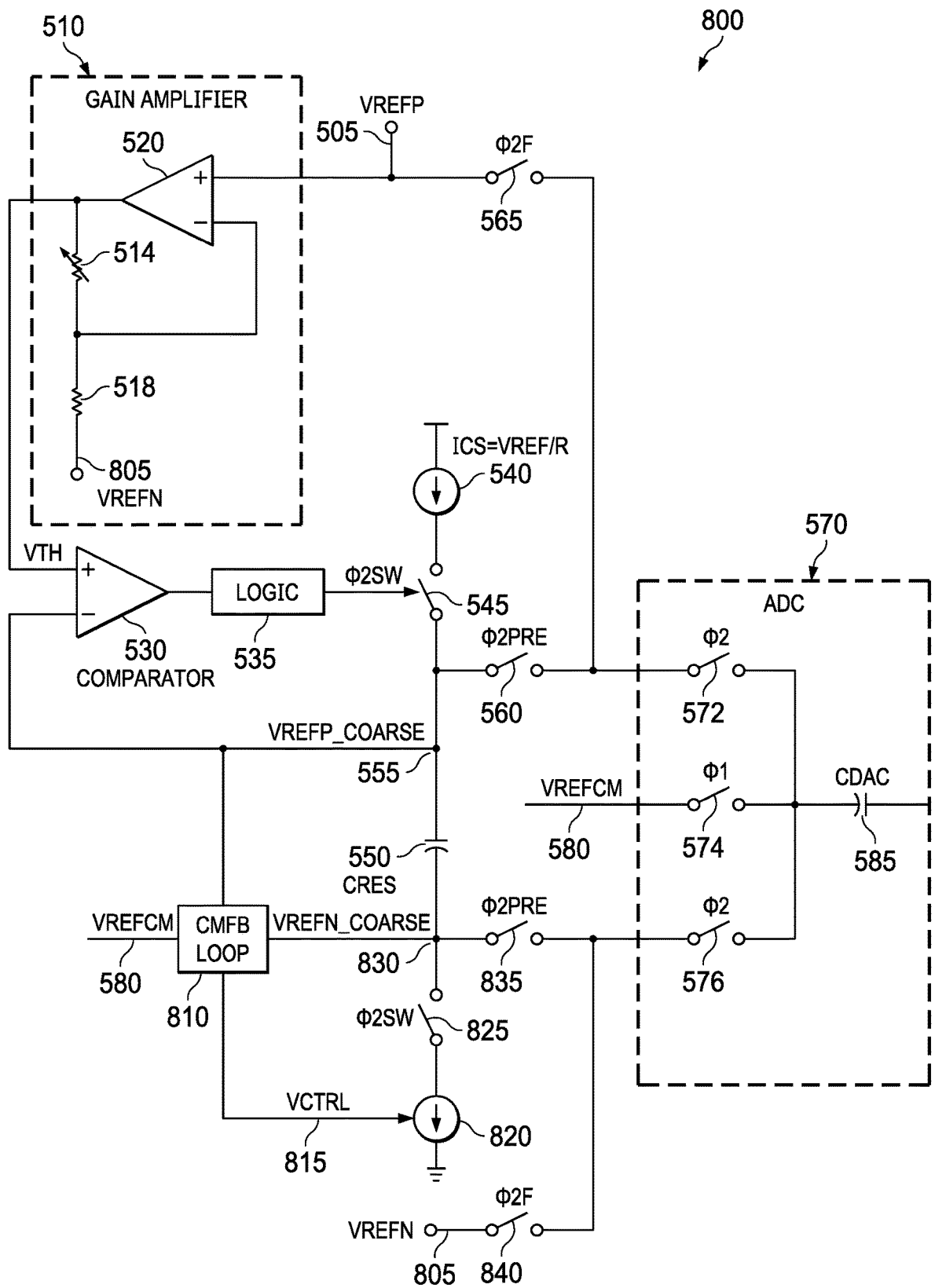
FIG. 8 illustrates an example differential reference precharge system for integration into an ADC.

FIG. 8 illustrates an example differential reference precharge system 800 for an ADC. Reference precharge system 800 described herein with reference to reference precharge system 500 shown in FIG. 5 for ease of illustration, and includes a common mode feedback (CMFB) loop 810, a current sink 820, and switches 825, 835, and 840. Cres 550 is coupled to node 830, rather than ground. CMFB loop 810 is coupled to nodes 555 and 830 and is configured to receive the common mode reference voltage Vrefcm 580. CMFB loop 810 outputs a control signal Vctrl 815 for current sink 820, which is connected to node 830 in the return path of the charging current Icharge from current source 540 by switch 825. Switch 835 couples node 830 to switch 576 during a coarse charging portion φ2PRE of the integration operation φ2. Switch 840 couples an external reference voltage generator providing the negative reference voltage Vrefn 805 to switch 576 during a fine charging portion φ2F of the integration operation φ2.

The voltage on node 555 is Vrefp_coarse, and the voltage on node 830 is Vrefn_coarse. To account for the finite capacitance of Cres 550 during charge sharing with Cdac 585, Vrefp_coarse is greater than Vrefp 505, and Vrefn_coarse is lower than Vrefn 805. CMFB loop 810 compares the Vrefcm 580 to half the sum of Vrefp_coarse and Vrefn_coarse, and generates the control signal Vctrl 815 to adjust current sink 820. CMFB loop 810 balances the current source 540 and current sink 820, similar to a differential amplifier. As described previously herein with reference to FIG. 5, the comparator 530 and current source 540 consume less power than an operational amplifier based precharge system. Current sink 820 and CMFB loop 810 consume less power than the reference precharge system 500.

Figure 9:
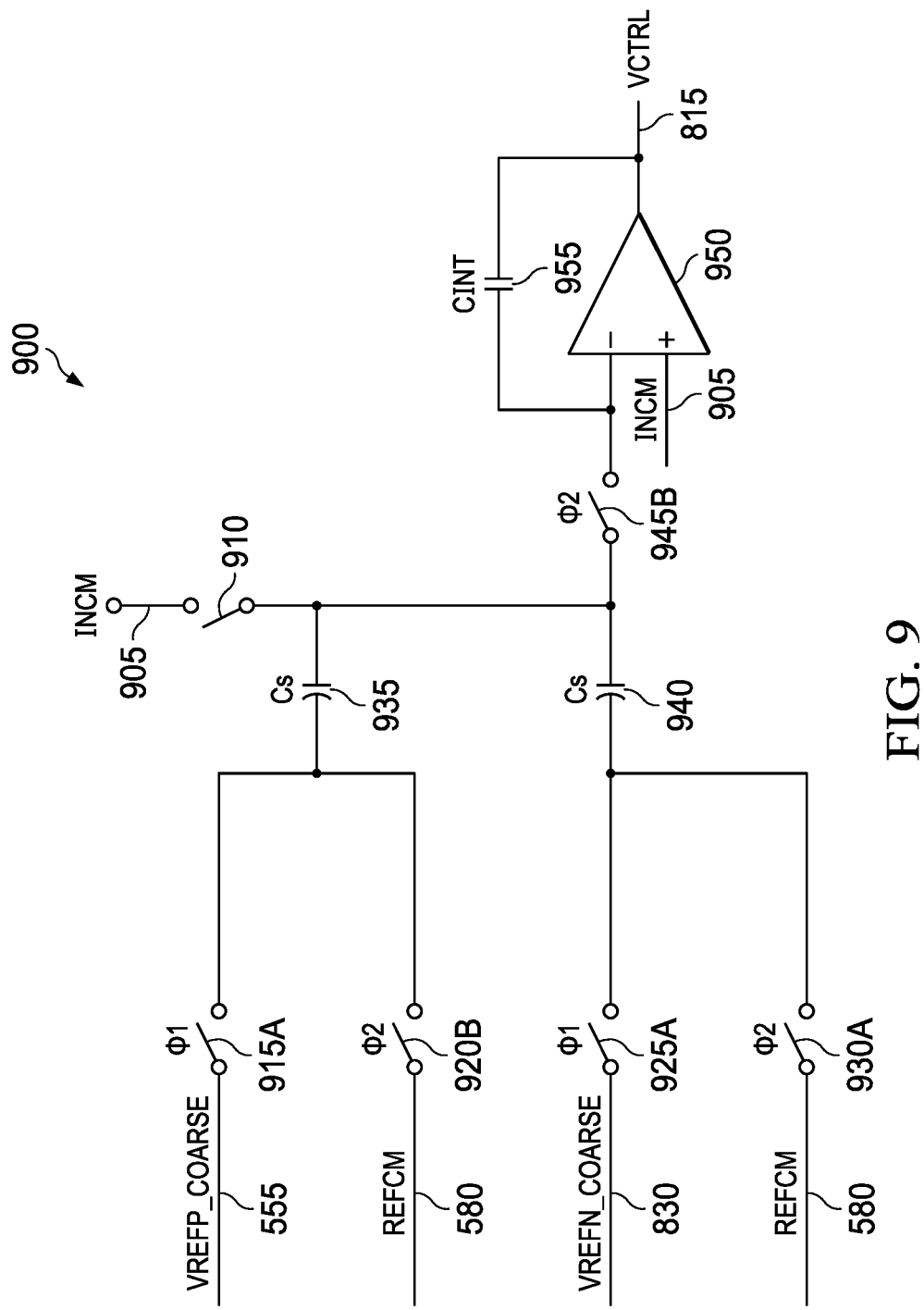
FIG. 9 illustrates an example common mode feedback loop for use in the differential reference precharge system shown in FIG. 8.

FIG. 9 illustrates an example common mode feedback loop 900 for use in the differential reference precharge system 800 shown in FIG. 8. CMFB loop 900 includes an amplifier 950, sampling capacitors Cs 935 and 940, integrating capacitor Cint 955, and switches 910, 915A, 920B, 925A, 930B, and 945B. Switch 915A couples node 555 with the voltage Vrefp_coarse to Cs 935 during a sampling operation φ1. Switch 920B couples the common mode reference voltage Vrefcm 580 to Cs 935 during an integration operation φ2. Switch 925A couples node 830 with the voltage Vrefn_coarse to Cs 940 during a sampling operation φ1. Switch 930B couples Vrefcm 580 to Cs 940 during an integration operation φ2.

Cs 935 and 940 are coupled together and to switches 910 and 945B. Switch 910 provides the input common mode voltage INCM 905. Switch 945B couples Cs 935 and 940 and INCM 905 to a negative input of amplifier 950. The positive input of amplifier 950 is configured to receive INCM 905. Integrating capacitor Cint 955 is coupled between the negative input and the output of amplifier 950. The ratio of the capacitance of integrating capacitor 955 and the capacitance of a sampling capacitor 935 or 940 determines the stability and responsiveness of CMFB loop 900. The output of amplifier 950 is the control signal Vctrl 815 for current sink 820. CMFB loop 900 samples the common mode across Cres 550 and compares it with Vrefcm 580.

Figure 10:
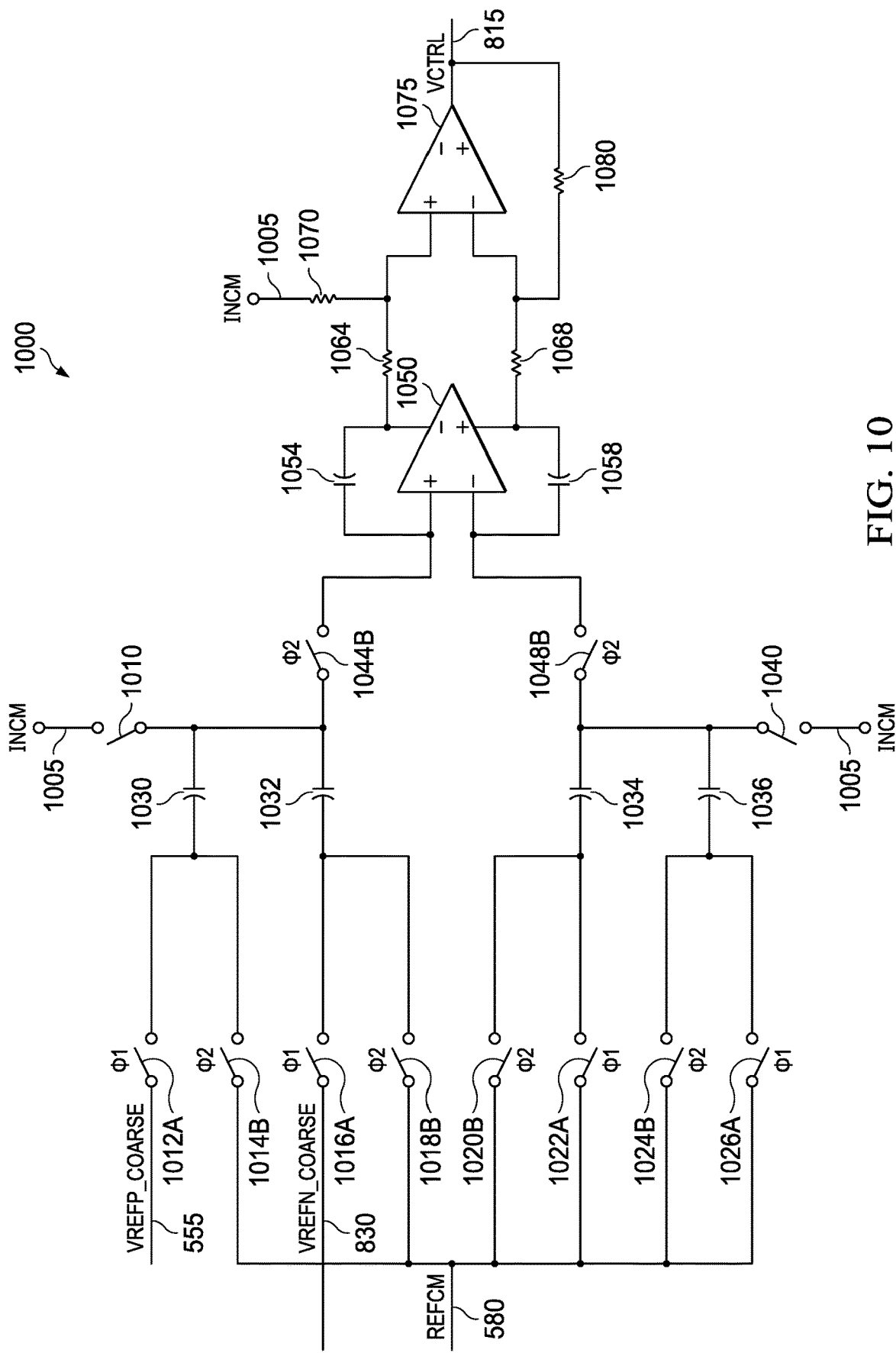
FIG. 10 illustrates a further example common mode feedback loop with differential integration for use in the differential reference system shown in FIG. 8.

FIG. 10 illustrates a further example common mode feedback loop 1000 with differential integration for use in the differential reference precharge system 800 shown in FIG. 8. CMFB loop 1000 includes switches 1010, 1012A, 1014B, 1016A, 1018B, 1020B, 1022A, 1024B, 1026A, 1040, 1044B, and 1048B; sampling capacitors Cs 1030, 1032, 1034, and 1036; sampling capacitors Cint 1054 and 1058; resistors 1064, 1068, 1070, and 1080; and amplifiers 1050 and 1075. Switch 1012A couples node 555 with Vrefp_coarse to Cs 1030 during sampling operation φ1. Switch 1014B couples Vrefcm 580 to Cs 1030 during an integration operation φ2. Switch 1016A couples node 830 with Vrefn_coarse to Cs 1032 during sampling operation φ1. Switch 1018B couples Vrefcm 580 to Cs 1032 during integration operation φ2. Switch 1020B couples Vrefcm 580 to Cs 1034 during integration operation φ2. Switch 1022A couples Vrefcm 580 to Cs 1034 during sampling operation φ1. Switch 1024B couples Vrefcm 580 to Cs 1036 during integration operation φ2. Switch 1026A couples Vrefcm 580 to Cs 1036 during sampling operation φ1.

Cs 1030 and 1032 are coupled together and to switches 1010 and 1044B. Switch 1010 provides the input common mode voltage INCM 1005. Switch 1044B couples Cs 1030 and 1032 and INCM 1005 to a positive input of amplifier 1050 during integration operation φ2. Cs 1034 and 1036 are coupled together and to switches 1040 and 1048B. Switch 1040 provides the input common mode voltage INCM 1005. Switch 1048B couples Cs 1034 and 1036 and INCM 1005 to a negative input of amplifier 1050 during integration operation φ2. Integrating capacitor Cint 1054 is coupled between the positive input and a negative output of amplifier 1050. Cint 1058 is coupled between the negative input and a positive output of amplifier 1050. The ratio of the capacitance of integrating capacitors 1054 or 1058 and the capacitance of sampling capacitors 1030, 1032, 1034, or 1036 determines the stability and responsiveness of CMFB loop 1000.

Resistor 1064 is coupled between the negative output of amplifier 1050 and the positive input of amplifier 1075. Resistor 1068 is coupled between the positive output of amplifier 1050 and the negative input of amplifier 1075. Resistor 1070 is coupled between the positive input of amplifier 1075 and a terminal providing the input common mode voltage INCM 1005. Resistor 1080 is coupled between the negative input and the output of amplifier 1075. Amplifier 1050 acts as a differential integrator. Amplifier 1075 acts as a differential to single-ended converter and outputs the control signal Vctrl 815.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An apparatus, comprising:
a gain amplifier coupled to a comparator and to a first voltage terminal;
a reservoir capacitor comprising a first terminal and, a second terminal wherein the comparator is further coupled to the first terminal;
a logic circuit coupled to the comparator and configured to generate a first control signal for a first switch and a second switch, wherein the first switch is configured to couple a current source to the first terminal of the reservoir capacitor, wherein the second switch is configured to couple a current sink to the second terminal of the reservoir capacitor;
a common mode feedback (CMFB) loop coupled to the second terminal of the reservoir capacitor, the first terminal of the reservoir capacitor, and a common mode voltage terminal, the CMFB loop configured to generate a second control signal for the current sink; and
a switching network configured to couple the first terminal of the reservoir capacitor to a first output and the second terminal of the reservoir capacitor to a second output based on a third control signal, and configured to couple the first voltage terminal to the first output and a second voltage terminal to the second output based on a fourth control signal.

2. The apparatus of claim 1, wherein the switching network comprises:
   a third switch configured to couple the first terminal of the reservoir capacitor to the first output;
   a fourth switch configured to couple the second terminal of the reservoir capacitor to the second output;
   a fifth switch configured to couple the first voltage terminal to the first output; and
   a sixth switch configured to couple the second voltage terminal to the second output.

3. The apparatus of claim 2, wherein the first and second outputs are coupled to an analog-to-digital converter (ADC), wherein the third control signal causes the third and fourth switches to be closed during a coarse charging portion of an integrating operation performed by the ADC, wherein the fourth control signal causes the fifth and sixth switches to be closed during a fine charging portion of the integrating operation performed by the ADC.

4. The apparatus of claim 1, wherein the gain amplifier comprises:
   an amplifier having a first input, a second input, and an amplifier output, wherein the first input is coupled to the first voltage terminal;
   a first resistor coupled to the second voltage terminal and to the second input; and
   a second resistor coupled to the second input and to the amplifier output.

5. The apparatus of claim 1, wherein the first and second outputs are coupled to an analog-to-digital converter (ADC), wherein the first control signal causes the first and second switches to be closed during a sampling operation performed by the ADC.

6. The apparatus of claim 1, wherein the CMFB loop generates the second control signal to adjust an amount of current through the current sink, such that a voltage on the common mode voltage terminal is substantially equal to half a voltage across the reservoir capacitor.

7. The apparatus of claim 1, wherein the first and second outputs are coupled to a feedback capacitor in an analog-to-digital converter (ADC), wherein the current source is configured to charge the reservoir capacitor such that a voltage across the reservoir capacitor is approximately equal to:

$$G(Vrefp - Vrefn) = \left(1 + \frac{Cdac}{Cres}\right)(Vrefp - Vrefn)$$

where G represents an overall gain, Cdac represents a capacitance of the feedback capacitor, Cres represents a capacitance of the reservoir capacitor, Vrefp represents a voltage on the first voltage terminal, and Vrefn represents a voltage on the second voltage terminal.

8. The apparatus of claim 7, wherein the gain amplifier has a gain G1, wherein the current source is configured to generate a charging current that is approximately equal to:

$$\frac{Vrefp - Vrefn}{R}$$

where R represents an internal resistance of the current source, wherein the overall gain G is substantially equal to:

$$G1 + \frac{tdelay}{RCres}$$

where tdelay represents a delay between a time at which an output of the gain amplifier is substantially equal to the voltage across the reservoir capacitor and a time at which the first and second switches disconnect the current source and the current sink from the reservoir capacitor.

9. A precharge circuit, comprising:
   a gain amplifier having a gain G1, the gain amplifier configured to receive an input voltage Vrefp and output an amplified voltage G1Vrefp;
   a comparator configured to compare the amplified voltage G1Vrefp and a voltage across a reservoir capacitor, and further configured to generate a control signal based on the comparison;
   a switch configured to couple a current source to the reservoir capacitor based on the control signal, wherein the current source is configured to generate a charging current for the reservoir capacitor; and
   a switching network configured to couple the reservoir capacitor to an output during a coarse charging portion of an integration operation performed by an analog to digital converter (ADC), wherein the output is configured to be coupled to a capacitor in the ADC, wherein the switching network is further configured to provide the input voltage Vrefp to the capacitor during a fine charging portion of the integration operation.

10. The precharge circuit of claim 9, wherein the input voltage Vrefp is a first input voltage, wherein the gain amplifier comprises:
    an amplifier having a first input, a second input, and an amplifier output, wherein the first input is configured to receive the first input voltage Vrefp;
    a first resistor coupled to the second input and configured to receive a second input voltage Vrefn; and
    a second resistor coupled to the second input and to the amplifier output.

11. The precharge circuit of claim 10, wherein the second resistor is a variable resistor, wherein a resistance of the second resistor is chosen to trim variations in the comparator over process and temperature.

12. The precharge circuit of claim 9, wherein the comparator is coupled to a logic circuit, wherein the logic circuit is configured to generate the control signal.

13. The precharge circuit of claim 9, wherein the input voltage Vrefp is a first input voltage, wherein the charging current is approximately:

$$\frac{Vrefp - Vrefn}{R}$$

where Vrefn represents a second input voltage and R represents an internal resistance of the current source, wherein the control signal causes the current source to charge the reservoir capacitor such that the voltage across the reservoir capacitor is approximately:

$$\left(G1 + \frac{tdelay}{RCres}\right)(Vrefp - Vrefn)$$

where Cres represents a capacitance of the reservoir capacitor and tdelay represents a delay between the amplified voltage G1Vrefp and the voltage across the reservoir capacitor being substantially equal and the control signal causing the switch to disconnect the current source from the reservoir capacitor.

14. The precharge circuit of claim 9, wherein the input voltage Vrefp is a first input voltage, wherein the control signal is a first control signal, wherein the switch is a first switch, wherein the output is a first output, wherein the reservoir capacitor comprises a first terminal and an second terminal, wherein the comparator is coupled to the first terminal, wherein the first switch is configured to couple the current source to the first terminal, and wherein the precharge circuit further comprises:
   a second switch configured to couple a current sink to the second terminal based on the first control signal; and
   a common mode feedback (CMFB) loop configured to:
      determine a common mode voltage for the reservoir capacitor;
      compare the common mode voltage for the reservoir capacitor to a reference common mode voltage; and
      generate a second control signal to adjust an amount of current through the current sink, such that the common mode voltage for the reservoir capacitor is substantially equal to the reference common mode voltage,
   wherein the switching network is further configured to couple the second terminal to a second output during the coarse charging portion, wherein the second output is configured to be coupled to the capacitor, wherein the switching network is further configured to provide a second input voltage Vrefn to the second output during the fine charging portion.

15. The precharge circuit of claim 14, wherein the CMFB loop comprises:
   an amplifier having a first input, a second input, and an output for the second control signal, wherein the first input is configured to receive an input common mode voltage; and
   a switched capacitor circuit coupled to the first and the second inputs, the cathode and the anode, wherein the switched capacitor circuit is configured to receive the reference common mode voltage.

16. The precharge circuit of claim 14, wherein the CMFB comprises:
   a differential switched capacitor integrator coupled to the cathode and to the anode, the differential switched capacitor integrator configured to receive the reference common mode voltage and an input common mode voltage; and
   a differential to single-ended amplifier coupled to the differential switched capacitor integrator and having an output for the second control signal.

17. An apparatus, comprising:
a first precharge circuit, comprising:
   a gain amplifier coupled to a first voltage terminal;
   a comparator coupled to the gain amplifier and to a first terminal of a capacitor, the comparator having an output for a first control signal, wherein a reservoir capacitor comprises the first terminal of the capacitor and a second terminal of the capacitor;
   a first switch configured to couple a current source to the first terminal of the capacitor based on the first control signal;
   a second switch configured to couple the first terminal of the capacitor to a first output during a first operating mode;
   a third switch configured to couple the first voltage terminal to the first output during a second operating mode; and
a second precharge circuit, comprising:
   a feedback loop coupled to the first terminal of the capacitor, the second terminal of the capacitor, and to a second voltage terminal, the feedback loop configured to generate a second control signal for a current sink;
   a fourth switch configured to couple the current sink to the second terminal of the capacitor based on the first control signal;
   a fifth switch configured to couple the capacitor anode to a second output during the first operating mode; and
   a sixth switch configured to couple a third voltage terminal to the second output during the second operating mode.

18. The apparatus of claim 17, wherein the first precharge circuit further comprises a logic circuit coupled to the comparator and configured to generate the first control signal.

19. The apparatus of claim 17, wherein the first and the second outputs are configured to be coupled to a capacitor in an analog to digital converter (ADC), wherein the first operating mode corresponds to a coarse charging portion of an integration operation performed by the ADC, and wherein the second operating mode corresponds to a fine charging portion of the integration operation.

20. The apparatus of claim 17, wherein the feedback loop is configured to:
   determine a common mode voltage for the reservoir capacitor;
   compare the common mode voltage for the reservoir capacitor to a voltage on the second voltage terminal; and
   generate the second control signal to adjust an amount of current through the current sink, such that the common mode voltage for the reservoir capacitor is substantially equal to the voltage on the second voltage terminal.

* * * * *